United States Patent [19]

Fava

[11] Patent Number: 5,751,143
[45] Date of Patent: May 12, 1998

[54] OPTO-ELECTRONIC SYSTEM FOR THE ACQUISITION OF SIGNALS INDICATING THE PRESENCE OF A VOLTAGE AND ITS PHASE

[76] Inventor: Natale Fava, Corso Antony 11, I-10093 Collegno (Torino), Italy

[21] Appl. No.: 564,635

[22] Filed: Nov. 29, 1995

[51] Int. Cl.[6] .................................................. G01R 19/16
[52] U.S. Cl. ................................................ 324/96; 324/126
[58] Field of Search ............................. 324/73.1, 158.1, 324/750, 117 R, 126, 127, 96, 133, 752; 250/227.1, 310, 311; 356/368

[56] References Cited

U.S. PATENT DOCUMENTS

| | | | |
|---|---|---|---|
| 3,312,895 | 4/1967 | Garbuny . | |
| 3,363,174 | 1/1968 | Hudson et al. | 324/96 |
| 3,411,069 | 11/1968 | Kubler et al. | 324/96 |
| 3,943,367 | 3/1976 | Baker | 324/96 |
| 3,991,367 | 11/1976 | Chapman et al. | 324/96 |
| 4,070,572 | 1/1978 | Summerhayes | 324/96 |
| 4,074,193 | 2/1978 | Kohler | 324/126 |
| 4,269,483 | 5/1981 | Feldtkeller | 324/96 |
| 5,274,324 | 12/1993 | Schweitzer, Jr. | 324/96 |
| 5,420,502 | 5/1995 | Schweitzer, Jr. | 324/96 |

FOREIGN PATENT DOCUMENTS

| | | |
|---|---|---|
| 2746570 | 4/1979 | Germany . |
| 8812279 | 2/1989 | Germany . |

OTHER PUBLICATIONS

"Floating input, optically isolated, high-voltage measurement probe", C.A. Bleys, Rev. Sc. Instrum. vol. 47, No. 5, May, 1976, pp. 621–623.

"dc electric field meter with fiber-optic readout", Alan R. Johnston, et al., Rev. Sci. Instrum. 57 (11), Nov. 1986.

"Fibres Optiques En H.T. Un Potentiel Qui Fait la Difference", Mesures, No. 612, Oct. 23, 1989, Paris, France, pp. 41–45.

Primary Examiner—Vinh P. Nguyen
Attorney, Agent, or Firm—Sughrue, Mion, Zinn, Macpeak & Seas, PLLC

[57] ABSTRACT

An opto-electronic system for the acquisition of signals indicating the presence of a voltage and its phase in distribution boards, and generally in any medium voltage or high voltage installation by means of the use of optical fibers of PVC with consequent elimination of the risks of electrocution and of the problems of transmission of the signals themselves. The system employs an electro-optical convertor connected to a capacitive shunt for generating light signals indicative of the presence of a voltage and the phase angle on a conductor without making use of auxiliary sources of supply. The system can also be integrated in an insulating rod for checking overhead conductors.

18 Claims, 3 Drawing Sheets

5,751,143

OPTO-ELECTRONIC SYSTEM FOR THE ACQUISITION OF SIGNALS INDICATING THE PRESENCE OF A VOLTAGE AND ITS PHASE

BACKGROUND OF THE INVENTION

The present invention relates in general to systems for the acquisition of signals indicating the presence of a voltage and its phase in medium and high voltage apparatus, and more specifically refers to an opto-electronic system for the acquisition of such signals.

At present in many medium and/or high voltage systems the signal necessary for phase determination and for indicating the presence of a voltage is taken off, by means of an electric circuit, via a capacitive shunt applied externally or internally to the insulating support and/or to an insulator through which the conductor passes, or to the terminal of the cable and/or to the female coupling insulator thereof.

The sinusoidal electric signal provided by the shunt in question, which is characterised by a very modest short circuit current value (from a few units to several tens of micro amps) is utilised for:

- supplying a voltage presence indicator device having a gas discharge lamp,
- informing a phase concordance indicator device of electronic type provided with an autonomous auxiliary supply source,
- informing a voltage-presence indicator device of electronic type provided with an autonomous auxiliary supply source.

In relation to the very modest current provided by the capacitive shunt the transmission of electrical signals over a distance, by means of an electric circuit even of modest length (several meters) becomes difficult. Moreover the arrangements intended to satisfy the safety requirements for the personnel responsible for the monitoring give rise to a significant cost for auxiliary protection circuits and interfaces for the indicator devices.

In fact, given the voltages and currents present in the medium and high voltage conductors, the possible loss of insulation between the signalling system and the conductor, in the absence of suitable protection systems, would produce an electrical discharge of high intensity with serious risks for a human operator who may be working on the circuits for the purpose of verifying the the phase synchronisation or whatever other purpose.

SUMMARY OF THE INVENTION

The object of the present invention is that of overcoming the above-mentioned inherent disadvantages in the transmission of the signals over a distance, as well as that of obtaining, with low production cost, a system provided with a very high degree of safety against the risks of electrocution of the operators as a result of a breakdown characterised by the loss of insulation of the capacitive shunt.

According to the present invention this object is achieved by a system having the characteristics indicated in the claims which follow the present description.

BRIEF DESCRIPTION OF THE DRAWINGS

Further advantages and characteristics of the present invention will become apparent from the following detailed description given with the aid of the attached drawings, provided purely by way of non-limitative example, in which.

DETAILED DESCRIPTION OF THE INVENTION

Figure 1:
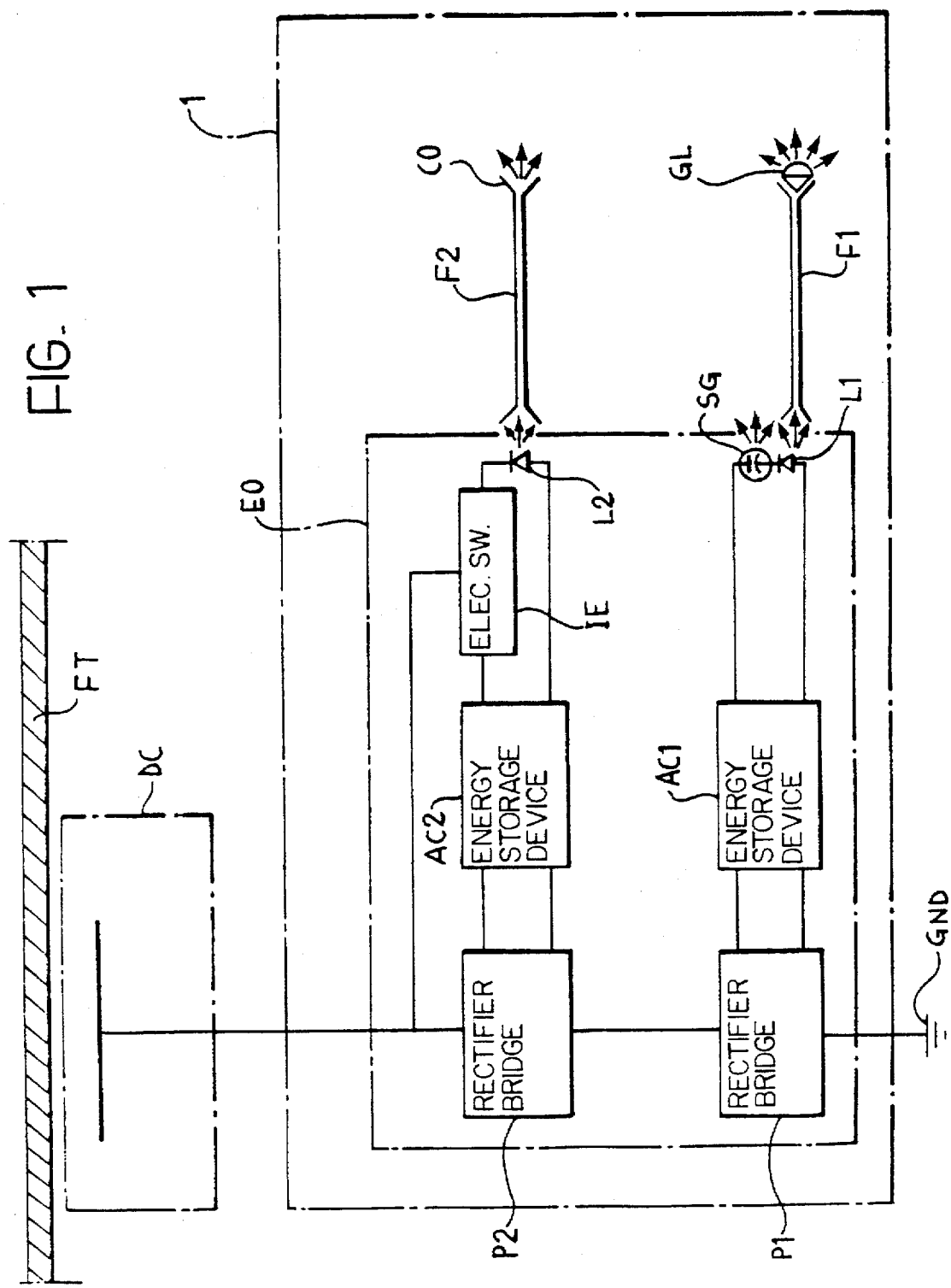
FIG. 1 is a block schematic diagram of an embodiment of the system according to the invention.

With the qualification that what follows is explained for a single high voltage or medium voltage phase, the system will now be described in detail with reference to FIG. 1.

The system 1 comprises a capacitive shunt or pick up DC as mentioned hereinabove and of known type, connected to the single phase FT of which it is desired to know the presence of voltage or information relating to the phase.

The nominal operating current range of the shunt DC lies between 2.5 µA and 35 µA, however with an adaptation of the electronic circuits it is possible to operate the system 1 with greater currents.

The system 1 is essentially constituted by an electro-optical converter EO which has the purpose of converting the electrical signals coming from the capacitive shunt DC into light signals.

The signalling requirements of systems of this type are the following:

- Light emissions have to be produced with a frequency greater than 0.5 Hz, both by a lamp positioned close to the conductor FT and by a lamp positioned at a distance, for example on the front part of the distribution panel or at a distance of 10 meters.
- The light emitted by the lamp, and likewise that produced by the remote lamp, must be clearly perceived by an operator positioned at a distance of 1 meter.
- A synchronisation signal has to be produced repetitively for each sinusoidal cycle of the voltage of the conductor FT.
- The synchronising signal must be produced and remain for a determined time, for a well defined angular position of the voltage vector with a repetition tolerance of ±1% for successive sinusoidal cycles. The intensity of this synchronisation signal, transmitted over a distance equal to 10 meters for example, must be sufficient to cause commutation of an auxiliary device provided with its own supply.

For the purpose of being able to fulfil the said functions the electro-optical convertor EO comprises a rectifier bridge P1 connected to the capacitive shunt DC. The rectifier bridge P1 rectifies the current pulses coming from the capacitive shunt DC.

Given that these pulses are, as already mentioned, of very weak intensity, the rectifier bridge. P1 is connected to an energy accumulator or storage device AC1 which serves to store the modest energy of the pulses coming from the capacitive shunt DC. The accumulator device AC1 is typically a capacitive device, that is to say it is formed by capacitors. When the energy stored in the accumulator device AC1 is sufficiently great discharge into a gas discharge lamp SG takes place. Consequently, upon the occurrence of the discharge there is an emission of a light pulse from the lamp SG detectable by a human observer.

Also connected to the accumulator device AC1, in series with the gas discharge lamp SG, is an LED diode L1. Consequently, when the light pulse emitted by the gas discharge lamp SG takes place there is also an emission of a corresponding pulse of light energy from the LED L1.

To the LED L1 is connected an optical fibre F1 in such a way that the emitted pulse of light energy can be transmitted over a distance. In particular the optical fibre F1 connected to the LED diode L1 terminates with a lens bulb GL, that is to say an optical device operable to diffuse and render perceptible the light energy transmitted along the optical fibre F1. The combination of the optical fibre F1 and the lens bulb GL therefore makes the light pulse emitted from the LED diode L1 visible at a distance. In this way the information relating to the presence of voltage on the phase FT can be transmitted over a distance of several meters and made visible to a human observer.

It is evident how this procedure presents significant advantages and is free from the disadvantages mentioned above. In particular there are no longer any risks due to the danger of electrocution in the case of there being a loss of insulation between the capacitive shunt DT and the phase FT. This is achieved because only the optical fibre F1 approaches close to the human observer, which being of non-conductive material can absolutely not transmit an electrical discharge. Moreover the device EO for the electro-optical conversion of the current pulses generated by the capacitive shunt DC is situated close to the capacitive shunt DC itself; this eliminates the necessity of transmitting the extremely weak generated electrical pulses over a distance, which pulses are sensitive to disturbances. By contrast the transmission takes place by light pulses along optical fibres with low loss and complete insensitivity to disturbance so that they can cover distance of several meters without difficulty.

According to the same principle transmission over a distance of the information relating to the phase of the voltage present on the conductor FT can be effected. For this purpose a second rectifier bridge P2 is employed and a second energy accumulator or storage device AC2, which is substantially similar to those described hereinabove. The second accumulator device AC2 is also connected to a LED diode L2 operable to emit pulses of light.

In this case however the emission of the light pulses by the LED diode L2 is no longer regulated by the occurrence of a discharge in a gas discharge lamp, but rather by an electronic switch IE. The electronic switch IE is connected not only to the accumulator device AC2 and to the LED diode L2, but also directly to the capacitive shunt DC in such a way as to be able to detect, on the basis of the current pulses emitted by the capacitive shunt DC, information relating to the phase. The electronic switch IE therefore emits to the LED diode L2 a short pulse in correspondence with each period detected on the phase FT in the manner explained hereinabove. The LED diode L2 is also connected to an optical fibre F2 in a manner similar to that for the LED diode L1. However, the end of the optical fibre F2 is not connected to a lens bulb, but to an optical connecter CO in such a way as to be able to carry the information relating to the phase over a distance by means of light impulses.

In this case, too, the advantage of having an optical conductor is evident in that, in the case of an electrical discharge the human operator who may possibly be connecting the optical fibre F2 to a phase concordance indicator device, does not run any risk of electrocution, nor is there any risk of destruction of the phase concordance indicator device which therefore can be completely free of electrical protection devices. It is obvious that the phase concordance indicator device must be adapted to operate upon the reception of light pulses and must be provided with complementary optical connecters.

The operation of the system 1 is moreover autonomous and does not require an auxiliary supply for the electronic circuits.

Figure 2:
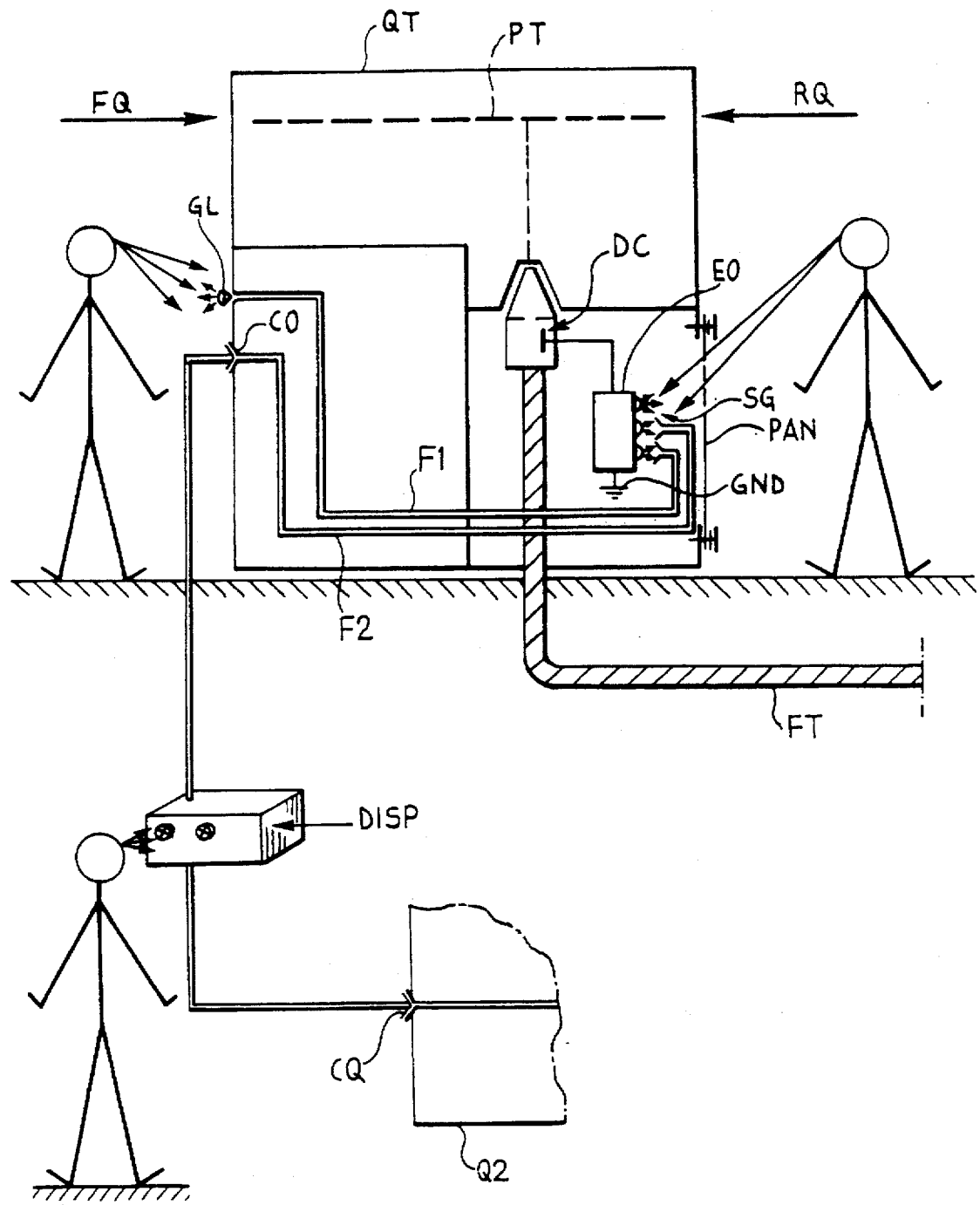
FIG. 2 is a schematic diagram of a medium voltage distribution panel employing the system according to the present invention.

The typical application of the system 1 to a medium voltage or high voltage board QT will now be described with reference to FIG. 2.

The board QT naturally includes a section PT containing the high voltage parts. To this section PT is connected a conductor or phase FT. On the phase FT is situated, as previously mentioned, the capacitive shunt DC to which the electro-optical convertor EC is connected. The electro-optical convertor EO is situated in the rear part RQ of the board QT in such a way that the gas discharge lamp SG is visible through a transparent portion of an inspection panel PAN.

The optical fibers F1, F2 on the other hand carry the information to the front part FQ of the board QT. On the front part FQ is therefore located the lens bulb GL and the optical connecter CO. As previously mentioned, it is possible to connect a phase concordance indicator device DISP to the connector CO by means of an optical fibre. Naturally, still by means of an optical fibre, the device DISP is connected to a second board Q2 in such a manner as to detect the phase concordance.

Figure 3:
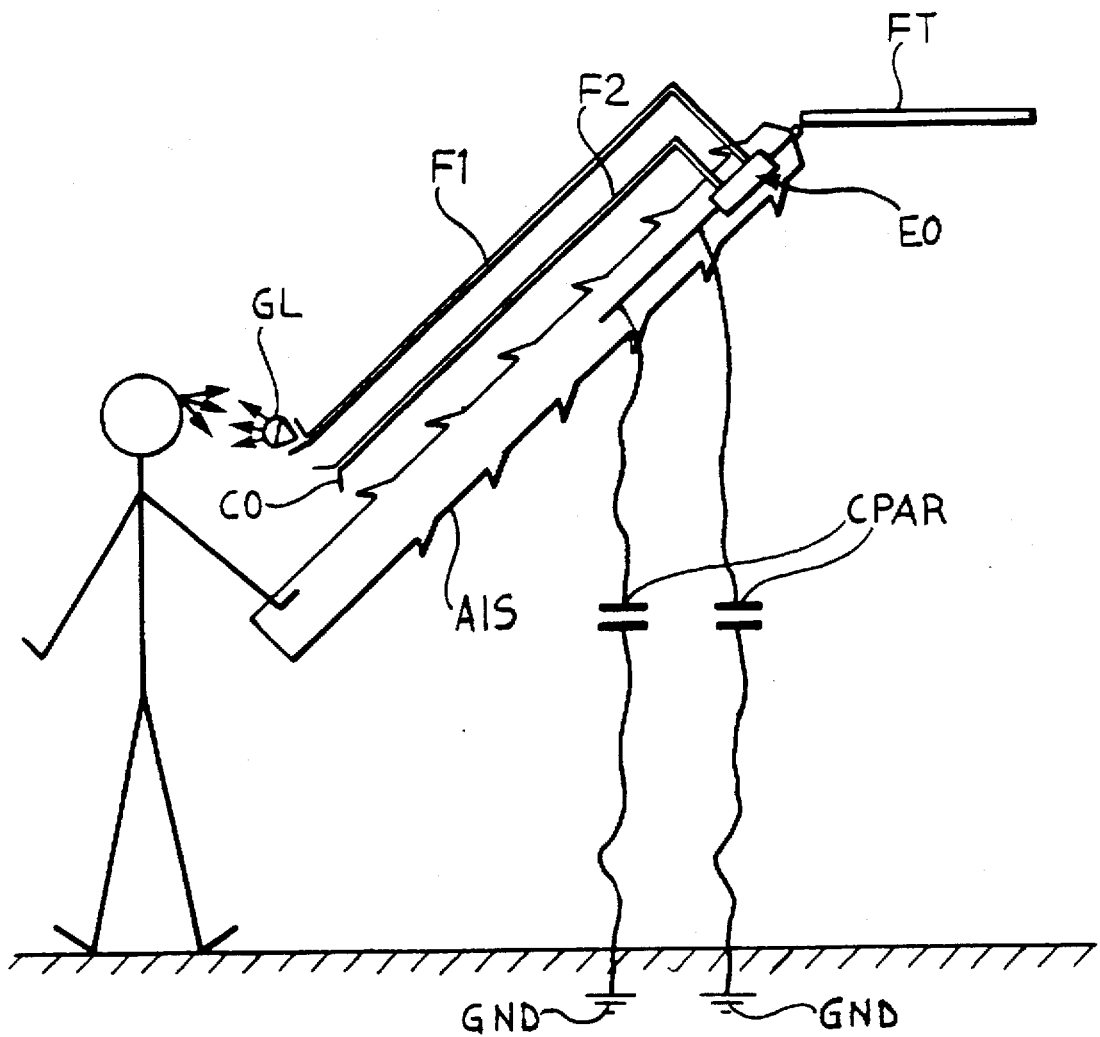
FIG. 3 is a schematic representation of an alternative embodiment of the system according to the invention.

In another advantageous embodiment, which will now be described with reference to FIG. 3, the present invention can be employed for the detection of information relating to the presence of a voltage and to its phase in overhead conductors or phases.

An overhead conductor FT can be touched by means of an insulating rod AIS carrying an electro-optical convertor EO according to the invention. The electro-optical convertor EO functions thanks to the parasitic capacitance CPAR present between it and ground GND which in practice performs the function of the capacitive shunt. In this case, too, the information relating to the presence of the voltage and to its phase is brought close to a human operator without any risk, by means of optical fibres F1, F2. The optical fibres F1, F2 terminate, as in the preceding case, with a lens bulb GL and an optical connector CO respectively.

In this way the insulating rod AIS can be handled without any risk on the part of the operator and does not necessitate complex and expensive safety devices to guarantee insulation since, for the major part of its length, it is made of insulating material. The rod AIS moreover makes it possible to monitor in an easy and safe manner the presence of a voltage on overhead conductors FT thus contributing to making the work of service personnel very much safer.

In a presently preferred embodiment the system envisages the use of flexible PVC optical fibres of low cost although it is possible to use different materials.

In summary the advantages achieved by the present invention are:
  very high security against the risk of electrocution (due to breakdown in the capacitive shunt DC with loss of insulation to the power part FT) in that the connection between the capacitive shunt DC and the interface points for phase monitoring and voltage-presence detection is made of insulating material,
  the possibility of transferring phase and voltage-presence signals over considerable distances with a high degree of immunity against environmental disturbances,
  low production costs.

Naturally the principle of the invention remaining the same, the details of construction and the embodiments can be widely varied with respect to what has been described and illustrated, without by this departing from the ambit of the present invention.

What is claimed is:

1. A system for the generation and transmission of signals indicative of characteristics of an A.C. voltage on a conductor, the system comprising:

capacitive pick up means operatively coupled to said conductor to produce electrical pulses in response to presence of an A.C. voltage on said conductor, electro-optical convertor means operatively connected to said capacitive pick up means and operable to convert said electrical pulses into light pulses;

said electro-optical convertor means includes rectifier bridge means connected to said capacitive pick up means and operable to rectify said electrical pulses, energy storage means connected to said rectifier bridge means and operable to store energy of several electrical pulses and at least one light emitter connected to said energy storage means; and optical conductor means coupled to said electro-optical convertor means and operable to convey said light pulses over a distance;

said electro-optical convertor means including detector means operatively connected to said capacitive pick up means and said at least one light emitter operable to emit signals indicative of a phase of the A.C. voltage on said conductor and said detector means comprising an electronic switch controlled by said electrical pulses generated by the said capacitive pick up means.

2. A system according to claim 1, wherein the said at least one light emitter comprises a gas discharge lamp.

3. A system according to claim 1, wherein the said at least one light emitter comprises a LED diode.

4. A system according to claim 3, wherein the said optical conductor means are connected to the said LED diode.

5. A system according to claim 1, wherein the electronic switch is operable to emit synchronising light pulse of brief duration in correspondence with a predetermined phase of the said alternating voltage.

6. A system according to claim 1, including a further light emitter and further optical conductor means connected to the said further light emitter.

7. A system according to claim 6, wherein the said further light emitter comprise a further LED diode.

8. A system according to claim 7, wherein the said electro-optical convertor means comprise:

further rectifier bridge means operatively connected to the said capacitive pick up means, further energy storage means interposed between the said further rectifier bridge means and the said further light emitter.

9. A system according to claim 8, wherein the said rectifier bridge means and the said further rectifier bridge means comprise rectifier bridges made with diodes.

10. A system according to claim 8, wherein the energy storage means and the further energy storage means comprise accumulator devices of capacitive type.

11. A system according to claim 10, wherein the said storage means comprise capacitors.

12. A system according to claim 6, wherein the said further optical conductor means comprise optical connector means operable to allow connection of external apparatus.

13. A system according to claim 6, wherein the said optical conductor means and the said further optical conductor means comprise optical fibres.

14. A system according to claim 13, wherein the said optical fibres are made of PVC.

15. A system according to claim 1, including an electrically insulating rod carrying at a first end the said electro-optical convertor means and the said first end of which can be brought into contact with an overhead conductor in such a way as to make available, by means of the said optical conductor means close to a second end, information relating to voltage and phase.

16. A system according to claim 15, wherein the said capacitive pick up means operates as a result of parasitic capacitances present between the said electro-optical convertor means and ground.

17. A system according to claim 1, wherein the said optical conductor means include an optical diffuser operable to render the said light pulses perceptible.

18. A system according to claim 17, wherein the said optical diffuser comprises a lens bulb.

* * * * *